US007633035B2

(12) United States Patent
Kirmeier

(10) Patent No.: US 7,633,035 B2
(45) Date of Patent: Dec. 15, 2009

(54) REVERSE SIDE FILM LASER CIRCUIT ETCHING

(75) Inventor: Josef Kirmeier, Los Gatos, CA (US)

(73) Assignee: Mu-Gahat Holdings Inc. (VG)

( * ) Notice: Subject to any disclaimer, the term of this patent is extended or adjusted under 35 U.S.C. 154(b) by 301 days.

(21) Appl. No.: 11/544,499

(22) Filed: Oct. 5, 2006

(65) Prior Publication Data

US 2008/0083715 A1    Apr. 10, 2008

(51) Int. Cl.
   *B23K 26/38*    (2006.01)
(52) U.S. Cl. .............................. 219/121.69; 219/121.68; 219/121.76
(58) Field of Classification Search ............ 219/121.69, 219/121.71, 121.76, 121.68, 121.7; 216/65
   See application file for complete search history.

(56) References Cited

U.S. PATENT DOCUMENTS

| | | | |
|---|---|---|---|
| 4,432,855 A | | 2/1984 | Romankiw |
| 4,508,749 A | | 4/1985 | Brannon |
| 4,878,212 A | | 10/1989 | Kuder |
| 4,925,523 A | | 5/1990 | Braren et al. |
| 5,073,694 A | * | 12/1991 | Tessier et al. ........... 219/121.71 |
| 5,173,441 A | * | 12/1992 | Yu et al. ................ 219/121.69 |
| 5,206,216 A | | 4/1993 | Yoshida |
| 5,296,674 A | * | 3/1994 | Praschek et al. ....... 219/121.69 |
| 5,523,543 A | | 6/1996 | Hunter, Jr. et al. |
| 5,529,829 A | | 6/1996 | Koskenmaki et al. |
| 5,584,956 A | | 12/1996 | Lumpp et al. |
| 5,874,369 A | | 2/1999 | Farooq et al. |
| 6,407,363 B2 | | 6/2002 | Dunsky |
| 6,440,503 B1 | * | 8/2002 | Merdan et al. .............. 427/561 |
| 6,617,541 B1 | | 9/2003 | Wadman |
| 6,662,439 B1 | | 12/2003 | Bhullar |
| 6,696,008 B2 | | 2/2004 | Brandinger |
| 6,872,589 B2 | | 3/2005 | Strandberg et al. |
| 7,014,885 B1 | | 3/2006 | Pique et al. |
| 7,073,246 B2 | | 7/2006 | Bhullar |
| 7,176,053 B1 | | 2/2007 | Dimmler |
| 2001/0006766 A1 | | 7/2001 | O'Brien |
| 2002/0158043 A1 | * | 10/2002 | Leu et al. ..................... 216/13 |
| 2003/0193545 A1 | | 10/2003 | Boucher et al. |
| 2003/0203602 A1 | | 10/2003 | Tanaka |

(Continued)

FOREIGN PATENT DOCUMENTS

JP    5-111780 A  *  5/1993

OTHER PUBLICATIONS

International Search Report (from a corresponding foreign applicaiton), PCT/US07/23127, mailed Jun. 5, 2008.

(Continued)

*Primary Examiner*—Geoffrey S Evans
(74) *Attorney, Agent, or Firm*—Charles L. Hamilton; Fountainhead Law Group PC

(57) ABSTRACT

A direct-write laser lithography system comprises a reel-to-reel feed system in a vacuum chamber that presents the clear film-side of a single-sided metal-clad tape to a laser for direct patterning of the metal. The laser beam is swept laterally across the tape by rotating mirrors, and is intense enough to ablate the metal but not so strong as to destroy the tape substrate. In one instance, two specialized lasers are used, one set to ablate large field areas, and the other tuned to scribe fine features and lines. The ablated metal blows off in a downward direction and is collected for recycling.

15 Claims, 4 Drawing Sheets

U.S. PATENT DOCUMENTS

| | | |
|---|---|---|
| 2005/0167829 A1 | 8/2005 | Brunner et al. |
| 2005/0242703 A1 | 11/2005 | Eckersley |
| 2006/0063351 A1 | 3/2006 | Jain |
| 2007/0130754 A1 | 6/2007 | Fein |
| 2007/0281247 A1 | 12/2007 | Phillips et al. |
| 2008/0120834 A1* | 5/2008 | Laksin et al. .......... 219/121.68 |

OTHER PUBLICATIONS

Dr. Mark Kowalski and Dr. James Caruso, "Digital Printing of Metallic Conductors in Support of the Burgeoning Plastic Electronics Industry," www.cabot-corp.com/peds. 2004 Cabot Corporation.

International Search Report (from a corresponding foreign application), PCT/US07/83250, mailed Mar. 31, 2008.

* cited by examiner

REVERSE SIDE FILM LASER CIRCUIT ETCHING

BACKGROUND OF THE INVENTION

1. Field of the Invention

The present invention relates to flexible circuits, and in particular to methods, systems, and devices for manufacturing flexible circuits in very high volumes and at very low costs.

2. Description of the Prior Art

Radio frequency identification device (RFID) technology is proliferating everywhere and into everything. Right now, a worldwide effort is stepping into high gear to replace the familiar universal product code (UPC) barcodes on products with RFID tags. The ink and labels used to print UPC barcodes is very inexpensive, and the costs of RFID chips and printed circuit antennas are under a lot of pressure to match them. Large, expensive items, of course, are not price sensitive to the cost of a typical RFID tag. But mass produced commodity items need tags that cost only a few cents.

The majority of printed circuit boards (PCB's) are made by depositing a layer of copper cladding over the entire substrate, then subtracting away the unwanted copper by chemical etching, leaving only the desired copper traces. Some PCB's are made by adding traces to a bare substrate by electroplating.

Three common subtractive methods are used to make PCB's. Etch-resistant inks can be screened on the cladding to protect the copper foils that are to remain after etching. Photoengraving uses a photomask to protect the copper foils, and chemical etching removes the unwanted copper from the substrate. Laser-printed transparencies are typically employed for phototools, and direct laser imaging techniques are being used to replace phototools for high-resolution requirements. PCB Milling uses a 2-3 axis mechanical milling system to mill away copper foil from the substrate. A PCB milling machine operates like a plotter, receiving commands from files generated in PCB design software and stored in HPGL or Gerber file format.

Additive processes, such as the semi-additive process starts with an unpatterned board and a thin layer of copper. A reverse mask is then applied. Additional copper is plated onto the board in the unmasked areas. Tin-lead and other surface platings are then applied. The mask is stripped away, and a brief etching step removes the now-exposed thin original copper laminate from the board, isolating the individual traces.

The additive process is commonly used for multi-layer boards because it favors making plating-through holes (vias) in the circuit board.

Circuit etching methods that use chemicals, coatings, and acids are slow, expensive, and not environmentally friendly. Mechanical etching has been growing rapidly in recent years. mechanical milling involves the use of a precise numerically controlled multi-axis machine tool and a special milling cutter to remove a narrow strip of copper from the boundary of each pad and trace.

Conventional laser etching of circuit traces is from the side with the metal to be etched. The metal, smoke, and debris goes flying directly in the path of the laser beam trying to do its work. The laser and its optics need frequent cleaning in order to maintain etching efficiency. But lasers can be a very fast, environmentally safe way to mass produce printed circuits, e.g., RFID's on flexible printed circuits (FPC) using DuPont's KAPTON polyimide film.

SUMMARY OF THE INVENTION

Briefly, a direct-write laser lithography embodiment of the present invention comprises a reel-to-reel or sheet feed system in a vacuum chamber that presents the reverse side of a single-sided metal-coated media to a laser for direct patterning of the metal. The laser beam is swept laterally across the media by rotating mirrors, and is intense enough to ablate the metal but not so strong as to destroy the media substrate. In one instance, two specialized lasers are used, one set to ablate large field areas, and the other tuned to scribe fine features and lines. The ablated metal blows off in a downward direction and is collected for recycling.

An advantage of the present invention is that a system is provided that can produce RFID circuits on flexible printed circuits at exceedingly low cost per unit.

Another advantage of the present invention is manufacturing method is provided that produces very little waste and that readily recycles the metals ablated from the tapes.

A further advantage of the present invention is manufacturing method for flexible printed circuits is provided for continuous production.

These and other objects and advantages of the present invention will no doubt become obvious to those of ordinary skill in the art after having read the following detailed description of the preferred embodiments which are illustrated in the various drawing figures.

IN THE DRAWINGS

DETAILED DESCRIPTION OF THE PREFERRED EMBODIMENT

Figure 1:
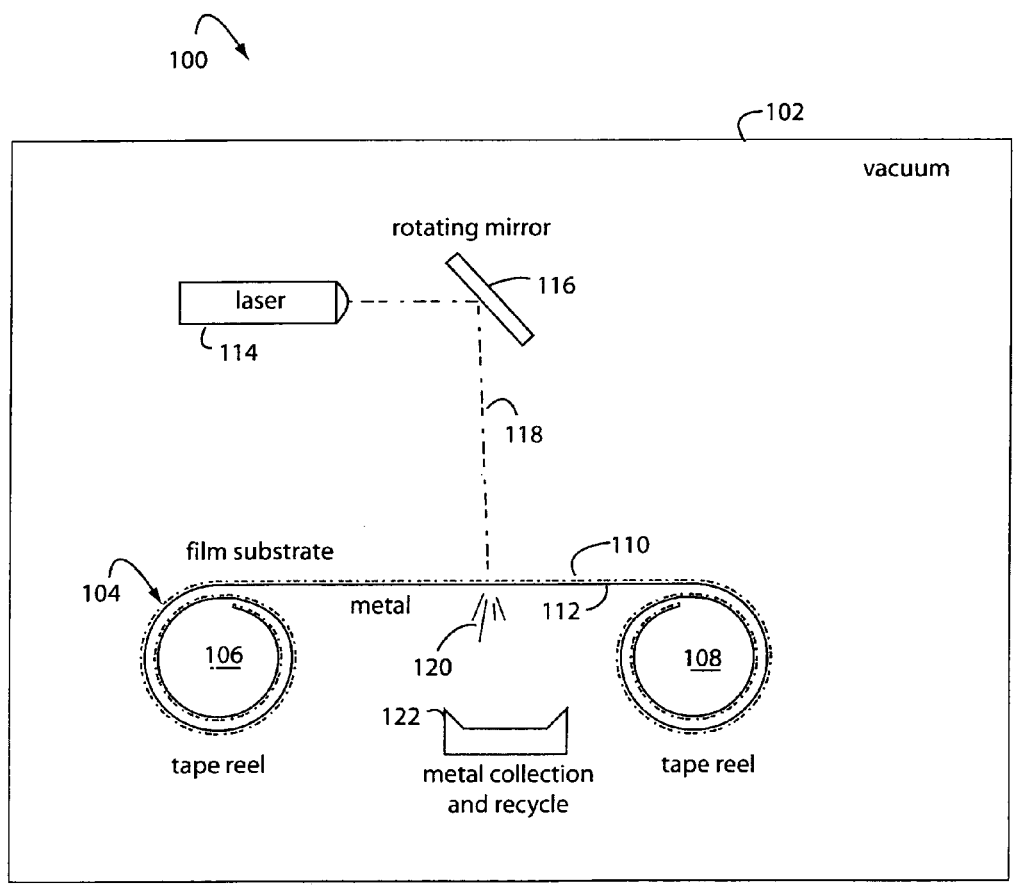
FIG. 1 is a functional block diagram of direct-write laser lithography system embodiment of the present invention that uses a single laser to ablate metal from film wound reel-to-reel or sheets feed from a sheet feeding system.

FIG. 1 represents a direct-write laser lithography system embodiment of the present invention, and is referred to herein by the general reference numeral 100. System 100 is used to manufacture flexible printed circuits (FPC), and comprises a vacuum chamber 102 in which are disposed a metal-on-film substrate tape 104 wound on a supply reel 106 and a take-up reel 108. A vacuum of about 115 torr (0.15 atm) is used. The tape 104 has a transparent film substrate 110 and a thin-film metal cladding 112. The transparent film substrate 110 may comprise polyimide, PEN, polyester, polycarbonate, etc. The thin-film metal cladding 112 may include copper (CU), aluminum (AL), platinum (PT), etc.

A laser 114 is used to ablate off the metal from the backside of tape 104 as it translates from supply reel 106 to take-up reel 108. A mirror 116 moves a laser beam 118 to various lateral points across the tape 104. Once laser beam 118 is positioned properly, a pulse of energy is generated enough to ablate metal 120 away. These are patterned to create electrical circuits, e.g., RFID antennas. A metal collection and recycle 122 captures the ablated metal 120 and recycles it.

It is important to observe that the ablated metal 120 does not fly or plume into the path of laser beam 118 because the ablation is on the opposite side to the laser. Further, laser beam 118 is unimpeded by normal atmosphere because the whole is enclosed in vacuum chamber 102. The result is less laser energy is needed to get the job done. If the laser energy is too high, the ablated material will convert to plasma and the vapors can coat components inside the chamber. The goal is to carry away pieces for recycling, so it is better if the ablation dislodges or tears away solid chunks of metal. So breaking the adhesive bond between the metal and the substrate of the tape is an important step in the ablation.

The materials used for the transparent film substrate 110 and the wavelength of laser beam 118 are chosen such that the energy absorbed by the substrate will be minimal and be able to pass the laser energy through to concentrate on ablating the metal 120. This could be assisted by placing an energy absorbing material between the transparent film substrate 110 and a thin-film metal cladding 112. The choice of type and power level of laser 114 will be empirically derived, but initial indications are that a 1.5 W carbon-dioxide laser will produce the desired results.

There is a balance between what kinds of laser beams 118 will be good for wide area ablating of metal, and what kind will provide clean sharp features. An alternative embodiment of the present invention uses two lasers, one for wide area ablating of metal, and the other set to write clean sharp features.

Figure 2:
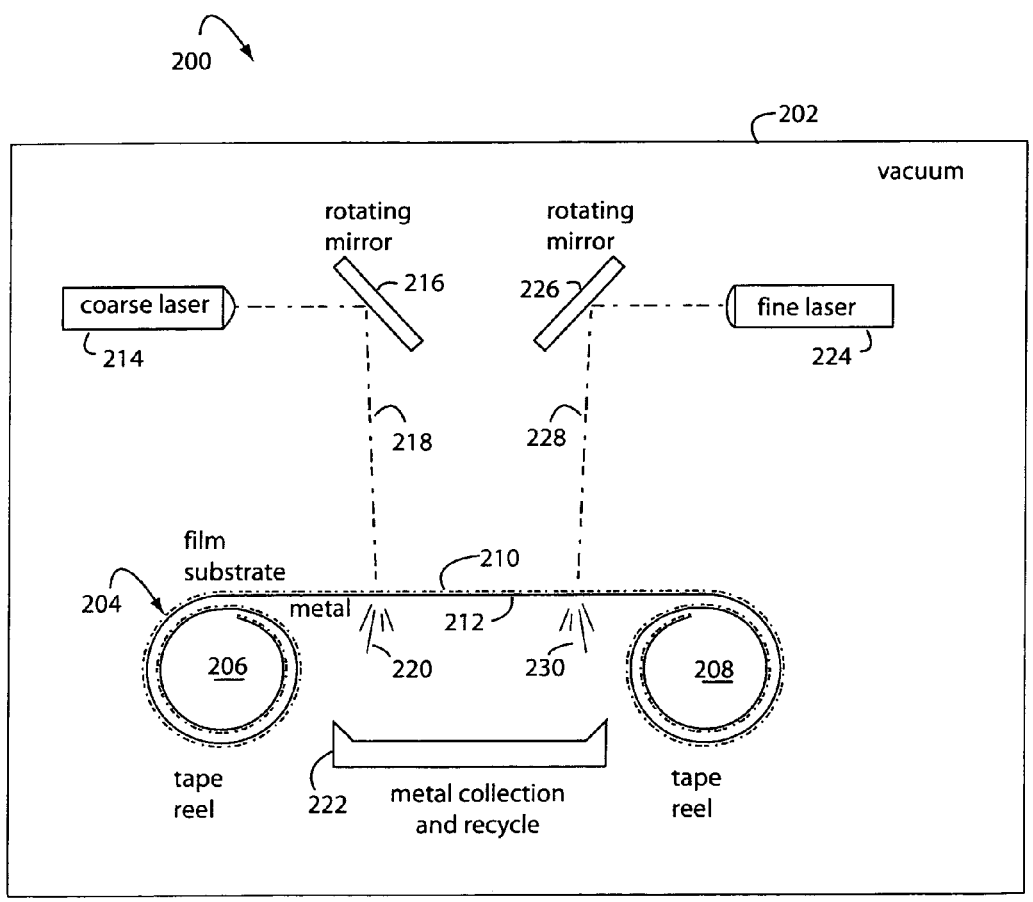
FIG. 2 is a functional block diagram of dual-direct-write laser lithography system embodiment of the present invention that uses a one laser to ablate wide fields of metal, and another set to scribe very fine lines and features.

FIG. 2 shows a dual direct-write laser lithography system embodiment of the present invention, and is referred to herein by the general reference numeral 200. System 200 is used to manufacture flexible printed circuits (FPC), and comprises a vacuum chamber 202 in which are disposed a metal-on-film substrate tape 204 wound on a supply reel 206 and a take-up reel 208. The tape 204 has a transparent film substrate 210 and a thin-film metal cladding 212. The transparent film substrate 210 may comprise polyimide, PEN, polyester, polycarbonate, etc. The thin-film metal cladding 212 may include copper (CU), aluminum (AL), platinum (PT), etc.

A coarse laser 214 is used to ablate off wide fields of metal from the backside of tape 204 as it translates from supply reel 206 to take-up reel 208. A first mirror 216 moves a coarse laser beam 218 to various lateral points across the tape 204. Once coarse laser beam 218 is positioned properly, a pulse of energy is generated to ablate field metal 220 away. Such ablated metal takes heat away and is caught and recycled by metal collection and recycle 222.

A fine laser 244 is used to ablate off fine lines of metal from the backside of tape 204, after it finishes with coarse laser beam 218. A second mirror 226 moves a fine laser beam 228 to various lateral points across the tape 204. Once fine laser beam 218 is positioned properly, e.g., within 50-micrometers, a pulse of energy is generated to ablate precise lines and spots of metal 230 away.

Gravity is used to assist the falling away and collection of ablated metals 220 and 230. It may also be useful to radius tape 204 so the substrate 210 is under compression and the metal cladding 212 is under tension where they encounter laser beams 118 and/or 228. Such mechanical stresses and the force of gravity can assist with ablation and not require all the separation energy come from the laser and its heating effects. Heating, or pre-heating tape 204 would also be helpful to get the materials up to the points where the metal will ablate more readily and with less violence.

Having to balance between what kinds of laser beams would be good for wide area ablating of metal, and what kind would provide clean sharp features is avoided in the system 200 of FIG. 2 by using the two different specialized lasers 214 and 224.

Various materials for substrate 110 and 210 can be used, the best depending on several variables. A typical substrate tape is 460 mm wide. Table I summarizes the properties of several popular materials. (As reported by LPKF Laser & Electronics AG.)

TABLE I

|  | KAPTON | APICAL | UPILEX | KALADEX | MYLAR | MAKROFOL |
|---|---|---|---|---|---|---|
| Tg (° C.) | 385 | >500 | >500 | 122 | 80 | 153 |
| CTE (ppm/° C.) | 15 | 12 | 8 | 20 | 20 | 70 |
| tensile strength Kpsi | 24 | 15-24 | 35 | 32 | 28-32 | 20-25 |
| water absorp. (%/wt.) | 2.9 | 2.2 | 1.2 | <1 | <1 | 0.35 |
| dielectric strength | 7 | 9.4 | 6.8 | 3.4 | 3.5 | 2.8 |

KAPTON, APICAL, and UPILEX are brand names of various forms of polyimide, KALADEX is a polyethylene naphthalate (PEN), MYLAR is a polyester, and MAKROFOL and LEXAN are polycarbonates.

The choice of metal for cladding 112 and 212 depends on several tradeoffs. In general, the thinner the metal, the easier is the laser ablation. Thinner materials will have higher sheet resistances, as measured in Ohms per square. A balance between these must be made. Copper is a good choice for circuit wiring, but the copper material absorbs and dissipates heat very efficiently, and that counters the spot heating effects the laser is trying to obtain for ablation. Aluminum is better in this regard, but gold and platinum may have to be used if the application is in a corrosive environment. The metals' reflectivity, absorptivity, and thermal conductivity are key parameters in the choice of metal to use. LPKF Laser & Electronics AG reported on three of these metals, as in Table II.

TABLE II

| metal | reflectivity 248 nm | thermal conductivity (W/cm2K−1) | Absorptivity 248 nm |
|---|---|---|---|
| copper | 0.366 | 3.98 | 0.62 |
| gold | 0.319 | 3.15 | 0.66 |
| aluminum | 0.924 | 2.37 |  |

Early proof-of-concept tests were made with different thicknesses of metal on a polyethylene terephthalate (PET)

substrate, and at different reel-to-reel tape speeds, e.g., 0.2 μm Cu at 2.5 m/s, 0.5 μm Cu at 2.5 m/s, 0.2 μm Al at 3.0 m/s, and 0.5 μm Al at 3.0 m/s. The laser was a 1.5 W CO2 laser.

Many kinds of lasing mediums are used for lasers, and the mediums determine the wavelength of the coherent light produced. The right one to use here depends on the films, metals, and processing speeds decided. Eximer lasers operate in the ultraviolet (UV), <425 nm. The Argon:Fluorine (Ar:F) laser operates at 193 nm, and Krypton:Fluoride (Kr:F) at 248 nm. The nitrogen UV laser emits light at 337 nm. The Argon laser is a continuous wave (CW) gas laser that emits a blue-green light at 488 and 514 nm. The potassium-titanyl-phosphate (KTP) crystal laser operates in green, around 520 nm. Pulsed dye lasers are yellow and about 577-585 nm. The ruby laser is red and about 694 nm. The synthetic chrysoberyl "alexandrite" laser operates in the deep red at about 755 nm. The diode laser operates in the near infrared at about 800-900 nm. The right laser to use in embodiments of the present invention will probably be the hazardous Class-IV types, e.g., >500 mW continuous, or 10 J/cm2 pulsed.

YAG lasers are infrared types that use yttrium-aluminum-garnet crystal rods as the lasing medium. Rare earth dopings, such as neodymium (Nd), erbium (Er) or holmium (Ho), are responsible for the different properties of each laser. The Nd:YAG laser operates at about 1064 nm, the Ho:YAG laser operates at about 2070 nm, and the "erbium" Er:YAG laser operates at just about 2940 nm. YAG lasers may be operated in continuous, pulsed, or Q-Switched modes. The carbon-dioxide (CO2) laser has the longest wavelength at 10600 nm.

Figure 3:
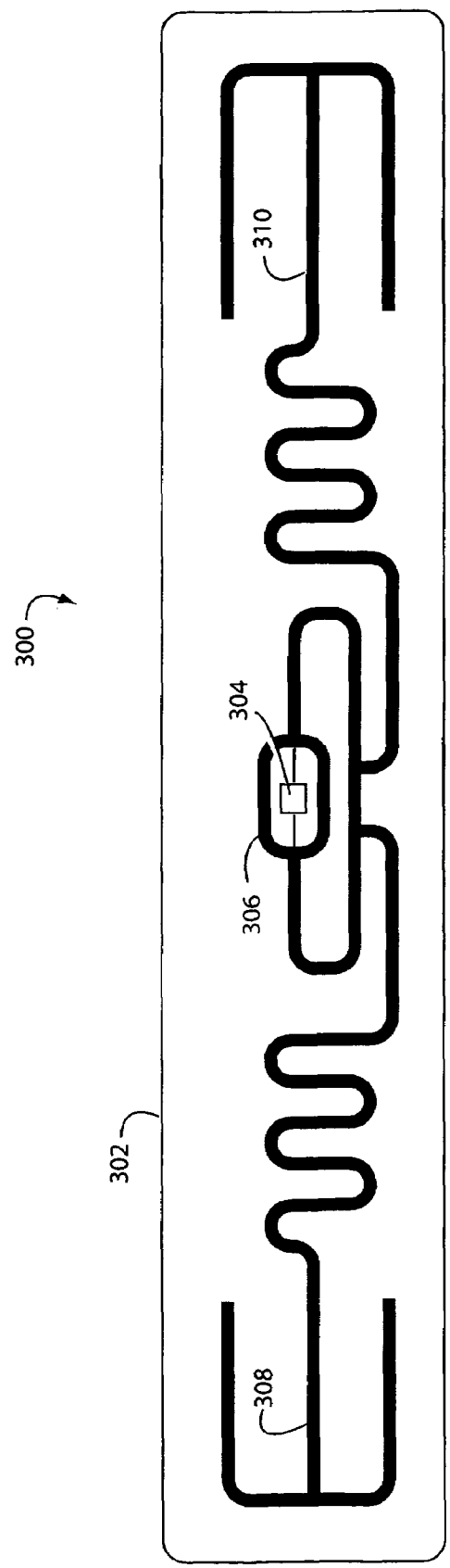
FIG. 3 is a plan view diagram of a typical RFID device constructed with a flex circuit antenna etched in the system of FIG. 1 or 2.

FIG. 3 represents an RFID device 300 with an antenna on a substrate manufactured with system 100 or 200. The RFID device 300 comprises a film substrate 302 on which has been laser-patterned a folded dipole antenna. A RFID chip 304 is attached to a bond area 306, and these are connected to left and right antenna elements 308 and 310.

Figure 4:
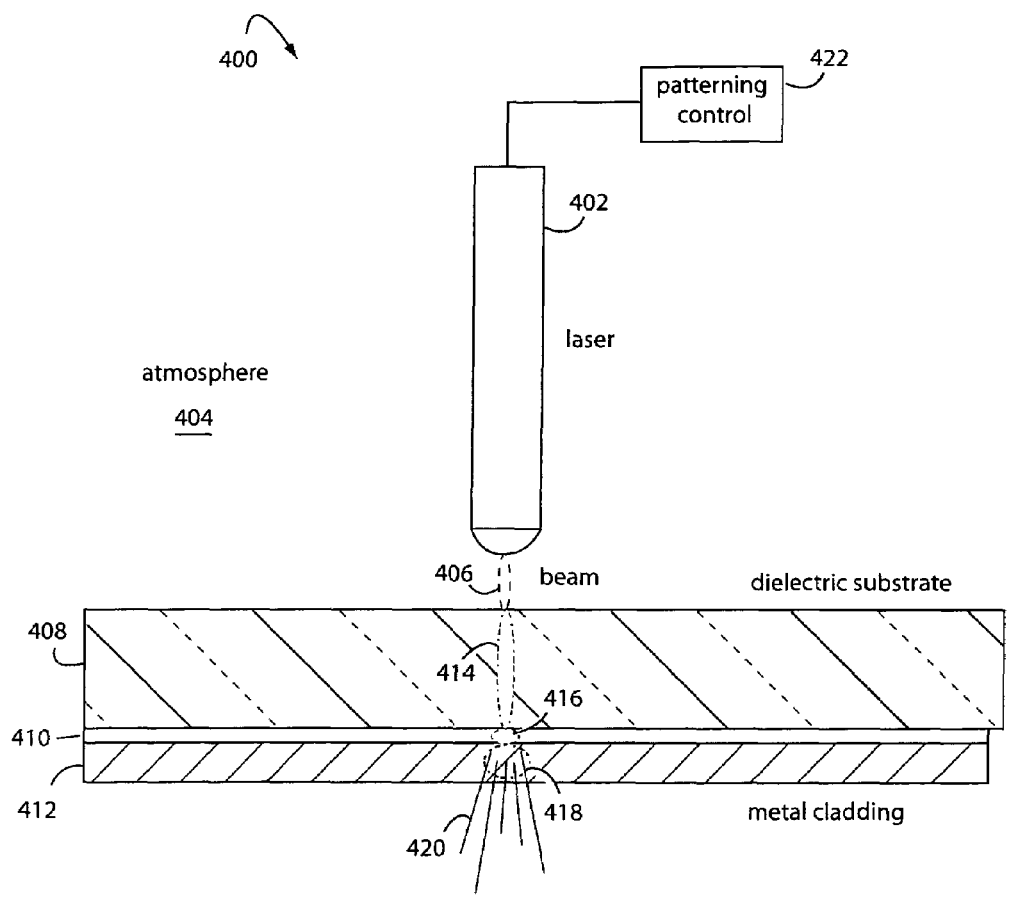
FIG. 4 is a cross-sectional view diagram of a reverse-side laser ablatement system embodiment of the present invention.

FIG. 4 represents a reverse-side laser ablatement system embodiment of the present invention, which is referred to herein by the general reference numeral 400. System 400 comprises a laser 402, such as a $CO_2$ laser that can operate a relatively high power levels. For example, 1.5 W. It operates in an atmosphere 404 selected to optimize laser operation and cost of operating the whole of system 404. For example, some applications will be able to do best with an atmosphere 404 of either normal air, reduced pressure, vacuum, or dry, or inert atmospheres like nitrogen or argon. A beam 406 of laser light travels through atmosphere 404 and enters the "back side" of a laminate comprising a dielectric substrate 408, an optional intermediate layer 410, and a metal cladding 412. If used, the intermediate layer 410 may comprise UV absorption materials, in the case of a UV laser 402, or other wavelength selective energy absorbing materials coordinated with the selection of laser 402.

It is important that the material which comprises dielectric substrate 408 be substantially transparent to the laser light beam 406 so that a transitioning beam 414 will be able to deposit a maximum of energy in an intermediate heating area 416 (if present) and metal ablatement area 418. The material of dielectric substrate 408 must survive the exposure to laser beam 406 with substantial no damage or heating. It can do that if such material is effective at transmitting the light wavelengths used by laser 402. So the choice of laser can affect the choice of materials for dielectric substrate 408, and vice versa.

Such heating area 416 is used to overpressure ablatement area 418 and stress it to assist in ablating metal 420. If intermediate layer 410 is not used, then transitioning beam 414 reaches metal ablatement area 418 directly and melts and vaporizes metal to produce ablating metal 420 according to patterns written by a patterning control 422. The metal cladding 412 may be pre-patterned to reduce the amount of metal that must be ablated on-line in final patterning, e.g., into RFID antenna circuits and other electronics boards.

In general, metal cladding 412 will comprise material conductive to electricity, and dielectric substrate 408 will comprise electrically insulative materials so that patterning control 422 can produce rigid or flexible printed circuits. Typical metals are copper, aluminum, gold, silver, platinum, etc. Typical insulators are polyimide, polycarbonate, silicon dioxide, alumina, glass, diamond, etc., in tapes, boards, films, and dice.

Laser 402, and in particular beam 406, is positioned in coordination with patterning control 422 by conventional means, e.g., pen-plotter mechanisms, x-y stages, micro-mirrors, etc. Additional lasers can be included to improve job throughput, or they can be specialized to do wide area or fine feature ablatements. Such lasers can use different wavelengths and laser types to assist in such specialization and job sharing.

The use of a pen-plotter type positioning mechanism for laser 402 would permit the propagation distance that beam 406 has to travel through atmosphere 404 to be kept to an absolute minimum. Such then would permit atmosphere 404 to be ordinary air, whereas a longer travel distance would necessitate the use of vacuum, as in FIGS. 1 and 2.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the "true" spirit and scope of the invention.

The invention claimed is:

1. A method for etching metal on a substrate, comprising:
placing a laminated sheet of metal and dielectric substrate in a vacuum;
directing a beam from a laser, also disposed in said vacuum, at the laminated sheet from the side of its dielectric substrate;
causing said laser beam to pass through said dielectric substrate and to ablate portions of said metal from underneath; and
using two beams from separate lasers wherein one is tuned to ablate wide field areas of metal and the other laser is optimized for scribing fine lines and features, and wherein the two lasers are coordinated to provide a single result.

2. The method of claim 1, further comprising:
configuring said laminated sheet into a tape; and
winding said tape in a reel-to-reel transport system disposed in said vacuum.

3. The method of claim 1, further comprising:
orienting said laminated sheet such that the metal side is down and gravity helps move ablated material away for recycling.

4. The method of claim 1, further comprising:
disposing a laser energy absorbing material between said dielectric substrate and said metal in the laminated sheet that assists in an underside laser ablation of the metal.

5. The method of claim 1, further comprising:
rotating a mirror in the path of said laser beam to provide for transverse movement of the points being ablated in the metal across said laminated sheet.

6. The method of claim 1, further comprising:
pre-heating said laminated sheet and/or mechanically stressing it to reduce the laser power needed to ablate said metal.

7. A dual-laser reel-to-reel direct write lithography system, comprising:
a vacuum chamber in which all other components are disposed;
a first laser for providing a laser beam sufficient to ablate wide areas of metal from a laminated film;
a first rotating laser beam mirror positioned to receive light from the first laser;
a second laser for providing a laser beam sufficient to ablate fine lines and features of metal from said laminated film;
a second rotating laser beam mirror positioned to receive light from the second laser; and
a reel-to-reel tape system for linearly presenting a laminated tape of a single side of metal on a dielectric substrate, and with said substrate facing up and to receive a transverse scan by the rotating first and second laser-beam mirrors;
wherein, laser energy is directed through the dielectric substrate of the laminated tape to ablate said metal from underneath.

8. A method for patterning metal cladding on a dielectric substrate, comprising:
placing a laser over a laminated sheet of metal and dielectric substrate;
directing a beam from said laser at the laminated sheet from the side of its dielectric substrate;
causing said laser beam to pass through said dielectric substrate and to ablate portions of said metal from underneath; and
using two beams from separate lasers wherein one is tuned to ablate wide field areas of metal and the other laser is optimized for scribing fine lines and features, and wherein the two lasers are coordinated to provide a single result.

9. The method of claim 8, further comprising:
controlling the operation and placement of said laser in relation to said laminated sheet to write patterns in metal carried on said dielectric substrate.

10. The method of claim 8, further comprising:
operating said laser near enough to said laminated sheet such that a vacuum atmosphere is unnecessary to obtain metal ablation by laser.

11. The method of claim 8, further comprising:
including a wavelength-specific energy absorbing material intermediate to said metal and dielectric substrate that will assist in laser ablation when exposed to said beam after it passes through said dielectric substrate.

12. A laser ablation machine for patterning metal cladding on a dielectric substrate, comprising:
means for placing a laser over a laminated sheet of metal and dielectric substrate;
means for directing a beam from said laser at the laminated sheet from the side of its dielectric substrate;
means for causing said laser beam to pass through said dielectric substrate and to ablate portions of said metal from underneath; and
means for using two beams from separate lasers wherein one is tuned to ablate wide field areas of metal and the other laser is optimized for scribing fine lines and features, and wherein the two lasers are coordinated to provide a single result.

13. The laser ablation machine of claim 12, further comprising:
means for controlling the operation and placement of said laser in relation to said laminated sheet to write patterns in metal carried on said dielectric substrate.

14. The laser ablation machine of claim 12, further comprising:
means for operating said laser near enough to said laminated sheet such that a vacuum atmosphere is unnecessary to obtain metal ablation by laser.

15. The method of claim 12, further comprising:
means for including a wavelength-specific energy absorbing material intermediate to said metal and dielectric substrate that will assist in laser ablation when exposed to said beam after it passes through said dielectric substrate.

* * * * *